(12) United States Patent
Iyoda et al.

(10) Patent No.: US 10,962,869 B2
(45) Date of Patent: Mar. 30, 2021

(54) COOLING DEVICE USED FOR COOLING A HEAT-GENERATING BODY, PROJECTOR INCLUDING THE COOLING DEVICE, AND HEAT-RECEIVING UNIT USED IN THE COOLING DEVICE

(71) Applicant: Panasonic Intellectual Property Management Co., Ltd., Osaka (JP)

(72) Inventors: Makoto Iyoda, Osaka (JP); Yasuhiro Miyamoto, Osaka (JP); Ichiro Kano, Yamagata (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/573,512

(22) Filed: Sep. 17, 2019

(65) Prior Publication Data

US 2020/0096849 A1 Mar. 26, 2020

(30) Foreign Application Priority Data

Sep. 21, 2018 (JP) .............................. JP2018-177740

(51) Int. Cl.
*G03B 21/16* (2006.01)
*H04N 9/31* (2006.01)
(Continued)

(52) U.S. Cl.
CPC ......... *G03B 21/16* (2013.01); *G03B 21/2033* (2013.01); *H04N 9/3144* (2013.01); *H05K 7/20272* (2013.01)

(58) Field of Classification Search
CPC .. G03B 21/16; G03B 21/2033; H04N 9/3144; H05K 7/20272; H05K 7/20309;
(Continued)

(56) References Cited

U.S. PATENT DOCUMENTS 5,412,536 A * 5/1995 Anderson ............. H01L 23/427
165/104.33
6,952,346 B2 * 10/2005 Tilton ................. H05K 7/20345
165/80.4
(Continued)

FOREIGN PATENT DOCUMENTS

JP 2012-26721 2/2012
WO 2017/203847 11/2017

*Primary Examiner* — Bao-Luan Q Le
(74) *Attorney, Agent, or Firm* — Wenderoth, Lind & Ponack, L.L.P.

(57) ABSTRACT

A liquid cooling-type cooling device includes a heat-receiving unit, a working fluid that transports heat, a radiator that cools the working fluid from the heat-receiving unit, and a pump. The heat-receiving unit includes a first component that is bottomed tubular, receives the heat from the heat-generating body, and gasifies the working fluid; a second component that is bottomed tubular, is disposed within the first component spaced apart from the first component by a predetermined gap, and has a base including a plurality of through-holes; an inlet for introducing the working fluid to a gasification space between the first component and the second component; an outlet for emitting the working fluid that has passed through the plurality of through-holes and has flowed medial of the second component; and an applier that applies a voltage to the first component and the second component.

3 Claims, 7 Drawing Sheets

(51) Int. Cl.
*H05K 7/20* (2006.01)
*G03B 21/20* (2006.01)

(58) Field of Classification Search
CPC .............. H05K 7/20327; H05K 7/2033; F28D 15/04–046; F28D 15/025; F28D 15/0266; H01L 23/427; H01L 23/4735
See application file for complete search history.

(56) References Cited

U.S. PATENT DOCUMENTS

| | | | | |
|---|---|---|---|---|
| 7,133,286 B2* | 11/2006 | Schmidt | ................ | H01L 23/473 361/718 |
| 7,277,283 B2* | 10/2007 | Campbell | ........... | H01L 23/4735 165/80.4 |
| 7,362,574 B2* | 4/2008 | Campbell | ........... | H01L 23/4735 361/699 |
| 7,375,962 B2* | 5/2008 | Campbell | ........... | H01L 23/4735 361/699 |
| 7,511,957 B2* | 3/2009 | Campbell | ................ | F28C 3/08 165/80.4 |
| 7,762,314 B2* | 7/2010 | Campbell | ................ | F28F 3/02 165/80.3 |
| 7,882,889 B2* | 2/2011 | Wu | ................ | F28D 15/043 165/104.23 |
| 7,885,074 B2* | 2/2011 | Campbell | ............ | H01L 23/427 361/700 |
| 8,074,706 B2* | 12/2011 | Su | ................ | F28D 15/046 165/104.26 |
| 9,099,295 B2* | 8/2015 | Kuhlmann | .............. | H01L 23/00 |
| 9,282,650 B2* | 3/2016 | Dhavaleswarapu | ... | B23K 3/085 |
| 9,748,199 B2* | 8/2017 | Dhavaleswarapu | ... | B23K 20/26 |
| 10,651,112 B2* | 5/2020 | Malouin, Jr. | ......... | F28D 1/0246 |
| 10,665,529 B2* | 5/2020 | Smith | ................ | G06F 1/20 |
| 2005/0185378 A1* | 8/2005 | Tilton | ................ | H05K 7/20345 361/699 |
| 2005/0248921 A1* | 11/2005 | Schmidt | ................ | H01L 23/473 361/698 |
| 2006/0162365 A1* | 7/2006 | Hoang | ................ | H01L 23/4735 62/259.2 |
| 2006/0250774 A1* | 11/2006 | Campbell | ........... | H01L 23/473 361/699 |
| 2007/0274045 A1* | 11/2007 | Campbell | ................ | F28F 7/00 361/699 |
| 2007/0284090 A1* | 12/2007 | Wu | ................ | F28F 13/00 165/104.26 |
| 2007/0295486 A1* | 12/2007 | Su | ................ | F28D 15/0233 165/104.26 |
| 2008/0037221 A1* | 2/2008 | Campbell | ........... | H01L 23/4735 361/699 |
| 2008/0062639 A1* | 3/2008 | Campbell | ........... | H01L 23/4735 361/689 |
| 2008/0264604 A1* | 10/2008 | Campbell | ................ | F28F 3/12 165/80.4 |
| 2008/0278913 A1* | 11/2008 | Campbell | ................ | F28C 3/08 361/699 |
| 2010/0328882 A1* | 12/2010 | Campbell | ............. | H01L 23/427 361/689 |
| 2014/0140006 A1* | 5/2014 | Kuhlmann | .............. | H01L 23/00 361/700 |
| 2015/0173209 A1* | 6/2015 | Dhavaleswarapu | . | B23K 20/026 228/194 |
| 2016/0211238 A1* | 7/2016 | Dhavaleswarapu | . | B23K 20/026 |
| 2019/0013258 A1* | 1/2019 | Malouin, Jr. | ....... | H01L 23/4735 |
| 2019/0086777 A1 | 3/2019 | Iyoda et al. | | |
| 2020/0027819 A1* | 1/2020 | Smith | ................ | G06F 1/20 |
| 2020/0168526 A1* | 5/2020 | Malouin, Jr. | ........... | F28F 13/06 |

* cited by examiner

COOLING DEVICE USED FOR COOLING A HEAT-GENERATING BODY, PROJECTOR INCLUDING THE COOLING DEVICE, AND HEAT-RECEIVING UNIT USED IN THE COOLING DEVICE

CROSS REFERENCE TO RELATED APPLICATION

This application claims the benefit of priority of Japanese Patent Application Number 2018-177740 filed on Sep. 21, 2018, the entire content of which is hereby incorporated by reference.

BACKGROUND

1. Technical Field

The present disclosure relates to a cooling device used for cooling a heat-generating body such as a semiconductor that laser oscillates, a projector included in the cooling device, and a heat-receiving unit used in the cooling device.

2. Description of the Related Art

Conventionally, there is an air cooling device in electronic devices and the like in which a heat sink is attached to a heat-generating body such as a CPU, the air cooling device cooling the heat-generating body by exposing the heat sink to air produced by a fan. There is also a water cooling device that cools a working fluid receiving heat from the heat-generating body and increasing in temperature, and returns the cooled working fluid to a portion to receive the heat again.

Since there are cases where air cooling devices and plain water cooling devices lack in performance with respect to a heat-generating body with a high calorific value included in electronic devices that aim to increase functionality, output, etc., cooling devices have been proposed that use latent heat of gasification when the working fluid is changed from a liquid state to a gaseous state, and that can cool the heat-generating body with high efficiency, like the cooling device recited in Japanese Unexamined Patent Application Publication No. 2012-26721.

With regard to, for example, a projector used in projection mapping using a laser light source that can simultaneously emit multiple laser light beams and in which images are projected in various directions due to the brightness of the light, however, there is a demand for cooling devices that can maintain high cooling efficiency regardless in which orientation the projector is disposed.

Hereinafter, a cooling device that can produce high cooling efficiency regardless of orientation, a heat-receiving unit used in the cooling device, and a projector included in the cooling device are disclosed.

SUMMARY

A cooling device according to the present disclosure includes a heat-receiving unit that receives heat from a heat-generating body; a working fluid that transports the heat received by the heat-receiving unit; a radiator that cools the working fluid from the heat-receiving unit; and a pump for moving the working fluid exiting the radiator to the heat-receiving unit. The heat-receiving unit includes a first component that is bottomed tubular, receives the heat from the heat-generating body, and gasifies the working fluid; a second component that is bottomed tubular, is disposed within the first component spaced apart from the first component by a predetermined gap, and has a base including a plurality of through-holes; an inlet for introducing the working fluid to a gasification space between the first component and the second component; an outlet for emitting the working fluid that has passed through the plurality of through-holes and has flowed medial of the second component; and an applier that applies a voltage to the first component and the second component each including a conductive material.

A projector according to the present disclosure includes a laser light source that emits laser light; a projection element that projects an image based on the laser light; and a cooling device that cools the laser light source. The cooling device includes a heat-receiving unit that receives heat from the laser light source; a working fluid that transports the heat received by the heat-receiving unit; a radiator that cools the working fluid from the heat-receiving unit; and a pump for moving the working fluid exiting the radiator to the heat-receiving unit. The heat-receiving unit includes a first component that is bottomed tubular, receives the heat from a heat-generating body, and gasifies the working fluid; a second component that is bottomed tubular, is disposed within the first component spaced apart from the first component by a predetermined gap, and has a base including a plurality of through-holes; an inlet for introducing the working fluid to a gasification space between the first component and the second component; an outlet for emitting the working fluid that has passed through the plurality of through-holes and has flowed medial of the second component; and an applier that applies a voltage to the first component and the second component each including a conductive material.

A heat-receiving unit, which is connected to a pump and cools a heat-generating body using a working fluid, according to the present disclosure includes a first component that is bottomed tubular, receives heat from the heat-generating body, gasifies the working fluid, and includes a conductor; a second component that is bottomed tubular, is disposed within the first component spaced apart from the first component by a predetermined gap, has a base including a plurality of through-holes, and includes a conductor; an inlet for introducing the working fluid to a gasification space between the first component and the second component; an outlet for emitting the working fluid that has passed through the plurality of through-holes and has flowed medial of the second component.

The cooling device, the projector, and the heat-receiving unit in the present disclosure can implement high cooling efficiency regardless of orientation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Embodiments of a cooling device and a heat-receiving unit used in the cooling device according to the present disclosure will be described next with reference to the drawings. Note that the following embodiments illustrate merely an example of the cooling device and the heat-receiving unit used in the cooling device according to the present disclosure. Therefore, the scope of the present disclosure is defined by the recitations in the claims, with reference to the following embodiments, and is not limited to only the following embodiments. Among the structural elements in the following embodiments, structural elements not recited in any one of the independent claims defining the most generic part of the present disclosure are not necessarily required to overcome the object of the present disclosure, but are described as structural elements of a more preferable form.

The drawings are schematic diagrams in which highlighting, omission, or adjustment of proportions have been carried out as necessary in order to describe the present disclosure, and may differ from the actual shapes, positional relationships, and proportions.

Embodiment 1

Figure 1:
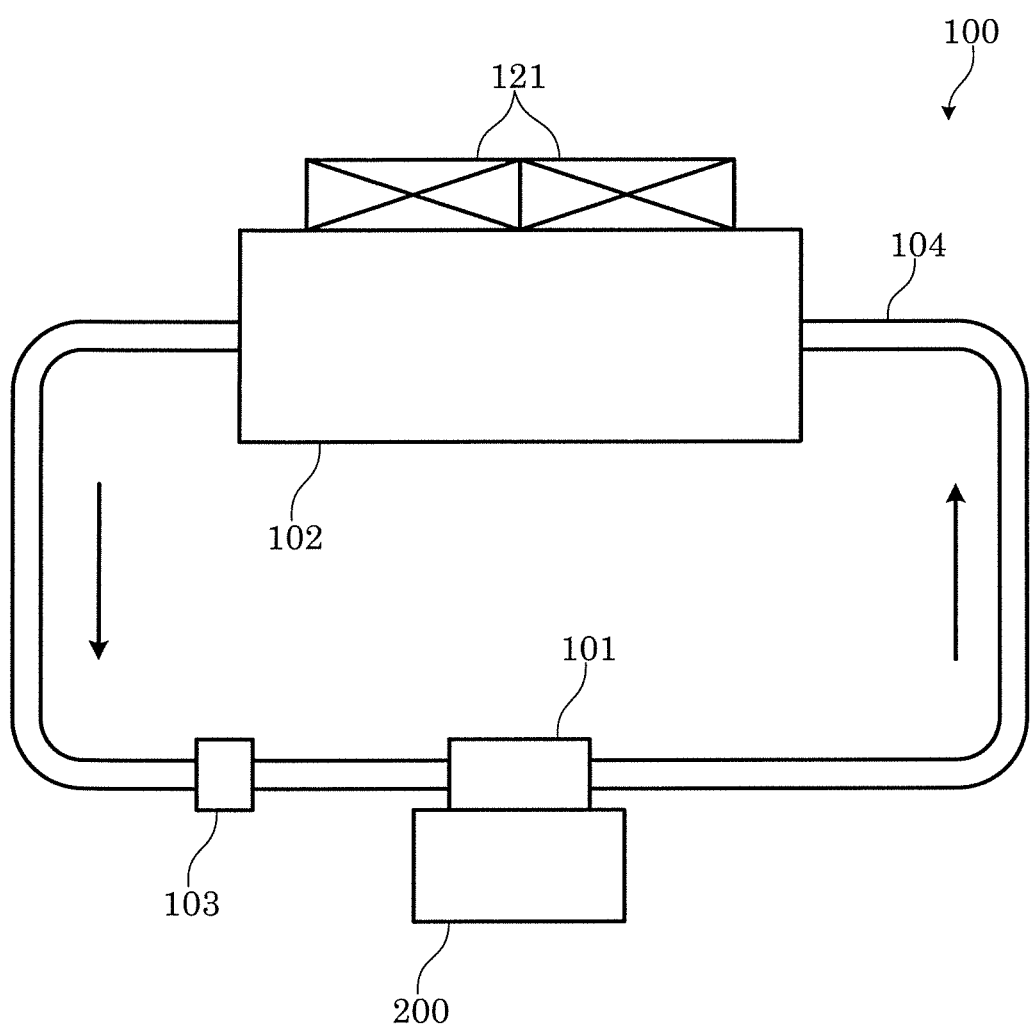
FIG. 1 is a diagram showing a circuit configuration of a cooling device according to Embodiment 1.

FIG. 1 is a diagram showing a circuit configuration of a cooling device.

As illustrated in the drawing, cooling device 100 is a system that cools heat-generating body 200 by releasing heat emitted from heat-generating body 200 in a predetermined location, and includes heat-receiving unit 101, radiator 102, pump 103, and pipe 104 that guides a working fluid.

The working fluid here is a fluid for transporting the heat, and also includes a liquid, gas, and a fluid in a state mixing the liquid and the gas in the present specification and in the scope of the claims.

Radiator 102 is a heat exchanger that exchanges the heat between the working fluid flowing circulating in an interior thereof and a fluid that contacts an exterior thereof. Radiator 102 also functions as a condenser since the working fluid gasified inside radiator 102 is liquefied.

In the case of the present embodiment, radiator 102 includes multiple narrow tubes (not illustrated in the drawings) disposed at a predetermined interval, fan 121 that circulates air through the narrow tubes, and functionality for cooling the working fluid and liquefying the gasified working fluid by exchanging the heat between the working fluid branching off and flowing in the narrow tubes and the air. Note that the heat may also be exchanged without the working fluid branching off.

Pump 103 is a device for coercively moving the working fluid from radiator 102 to heat-receiving unit 101 via pipe 104. Note that pump 103 is disposed on pipe 104, and is disposed at a portion for moving the working fluid from radiator 102 to heat-receiving unit 101 in FIG. 1, but may also be disposed at a portion for returning the working fluid from heat-receiving unit 101 to radiator 102. A performance of pump 103 is not particularly limited to the foregoing and is determined based on a calorific value of heat-generating body 200, a performance of radiator 102, etc. To give an example, in the case of heat-generating body 200 being a laser light source disposed in a projector, the performance of pump 103 is selected from, for example, a range of at least 5 ml/min and at most 200 ml/min. This is because the cooling performance of the cooling device is inadequate when under 5 ml/min. On the other hand, anything higher than 200 ml/min limits the gasification of the working fluid and a desired cooling performance cannot be obtained.

Figure 2:
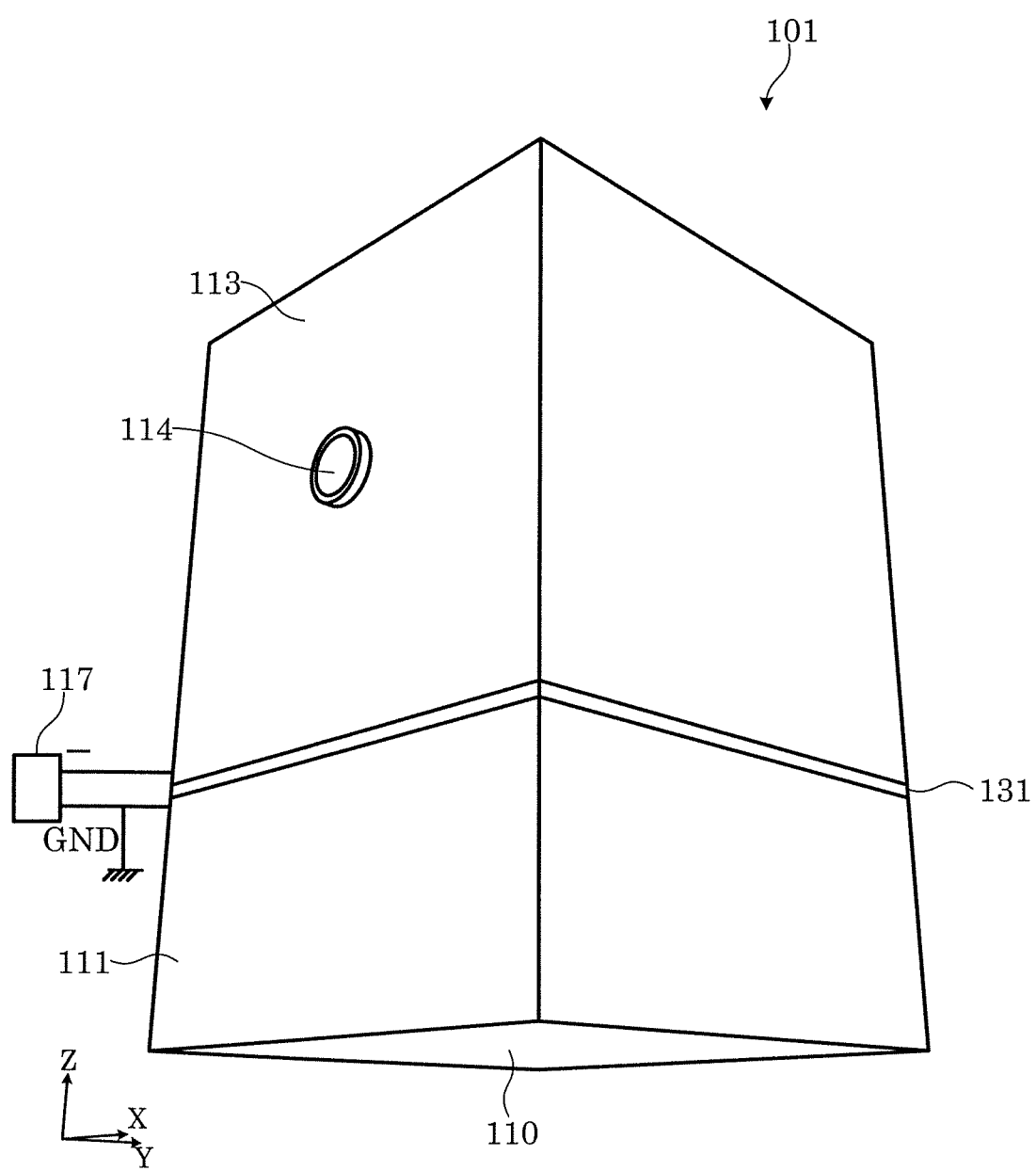
FIG. 2 is a perspective view of an exterior of a heat-receiving unit according to Embodiment 1.
Figure 3:
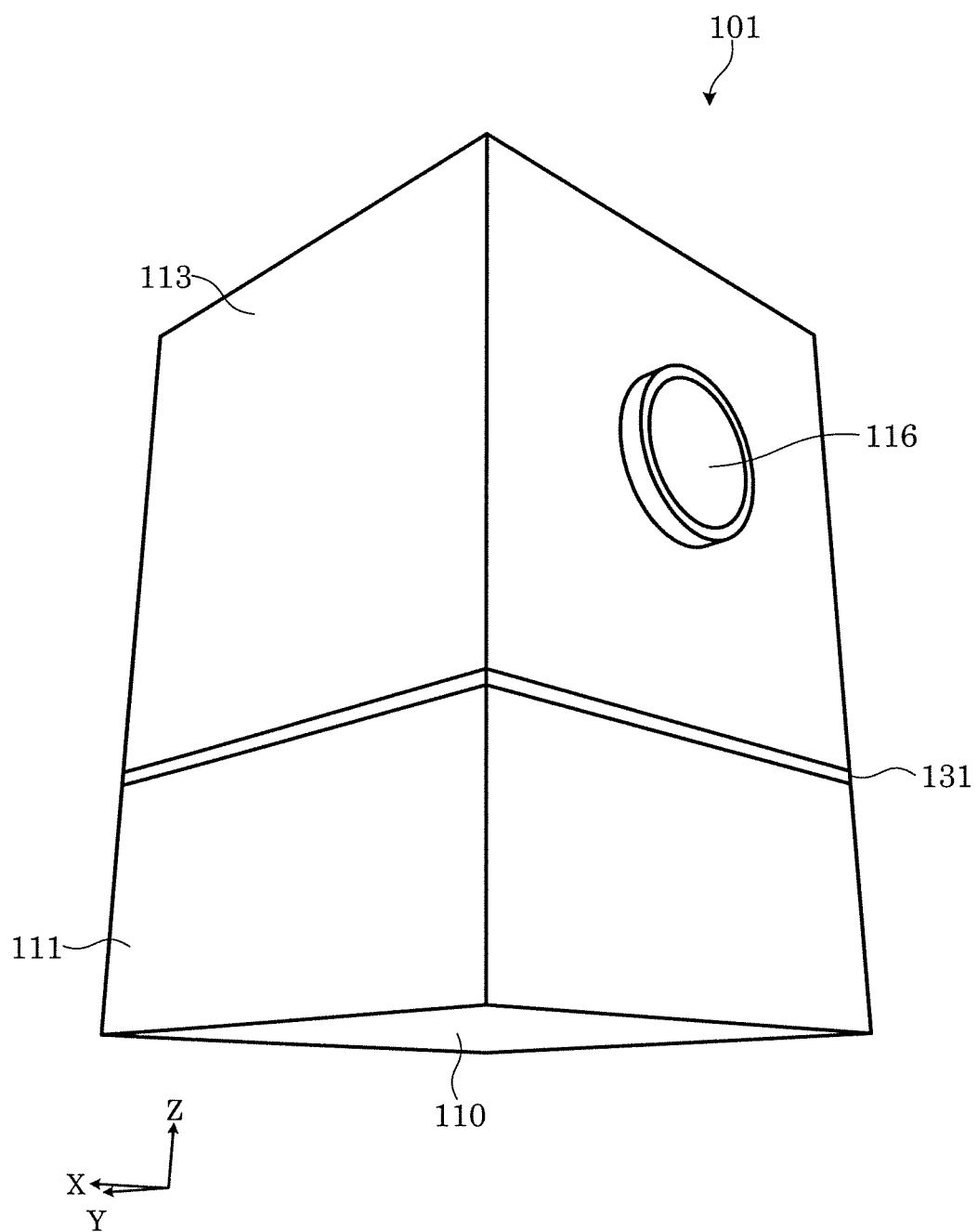
FIG. 3 is a perspective view of the exterior of the heat-receiving unit according to Embodiment 1.
Figure 4:
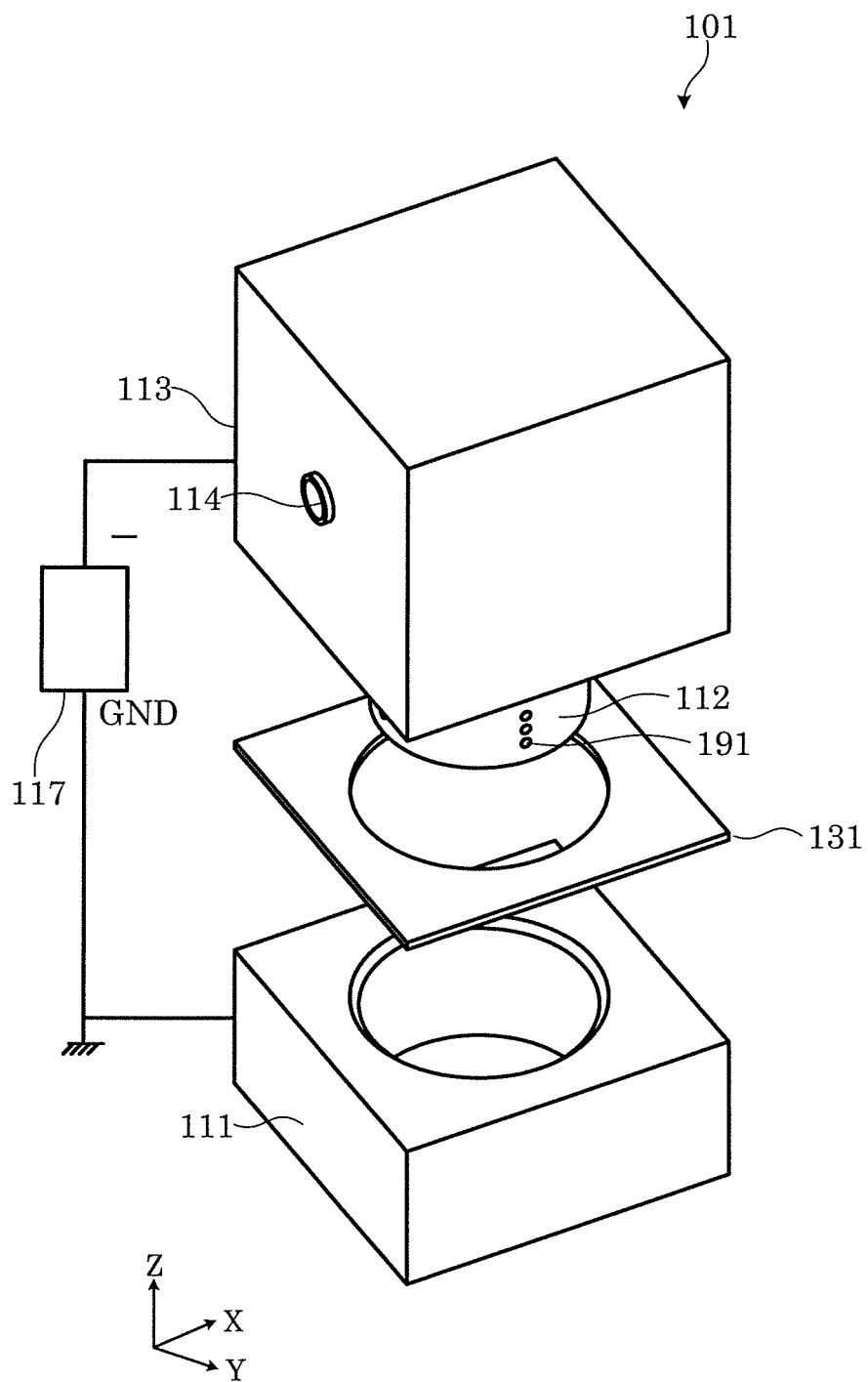
FIG. 4 is an exploded perspective view of the heat-receiving unit according to Embodiment 1.
Figure 5:
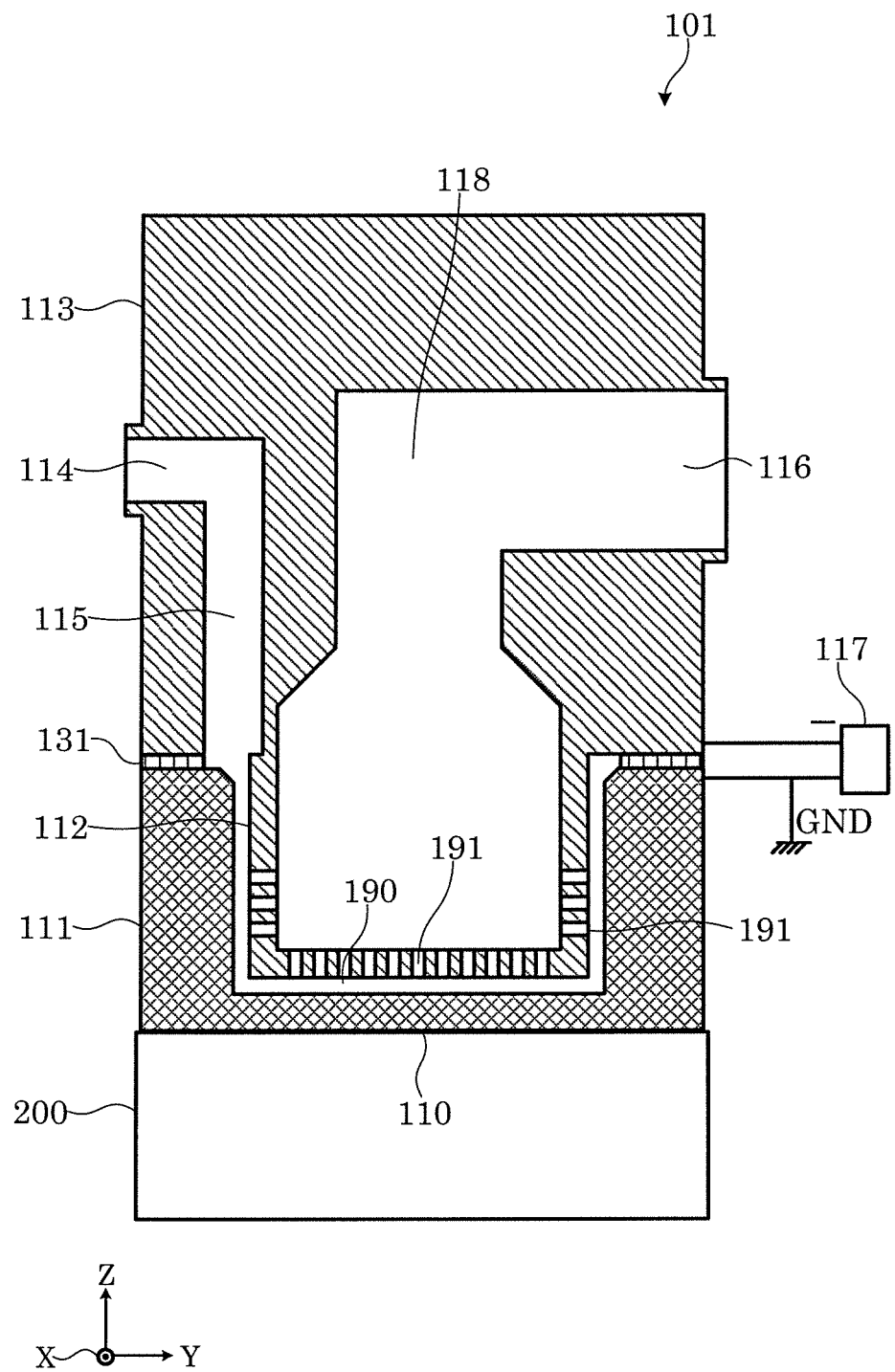
FIG. 5 is a cross-sectional view of the heat-receiving unit according to Embodiment 1.
Figure 6:
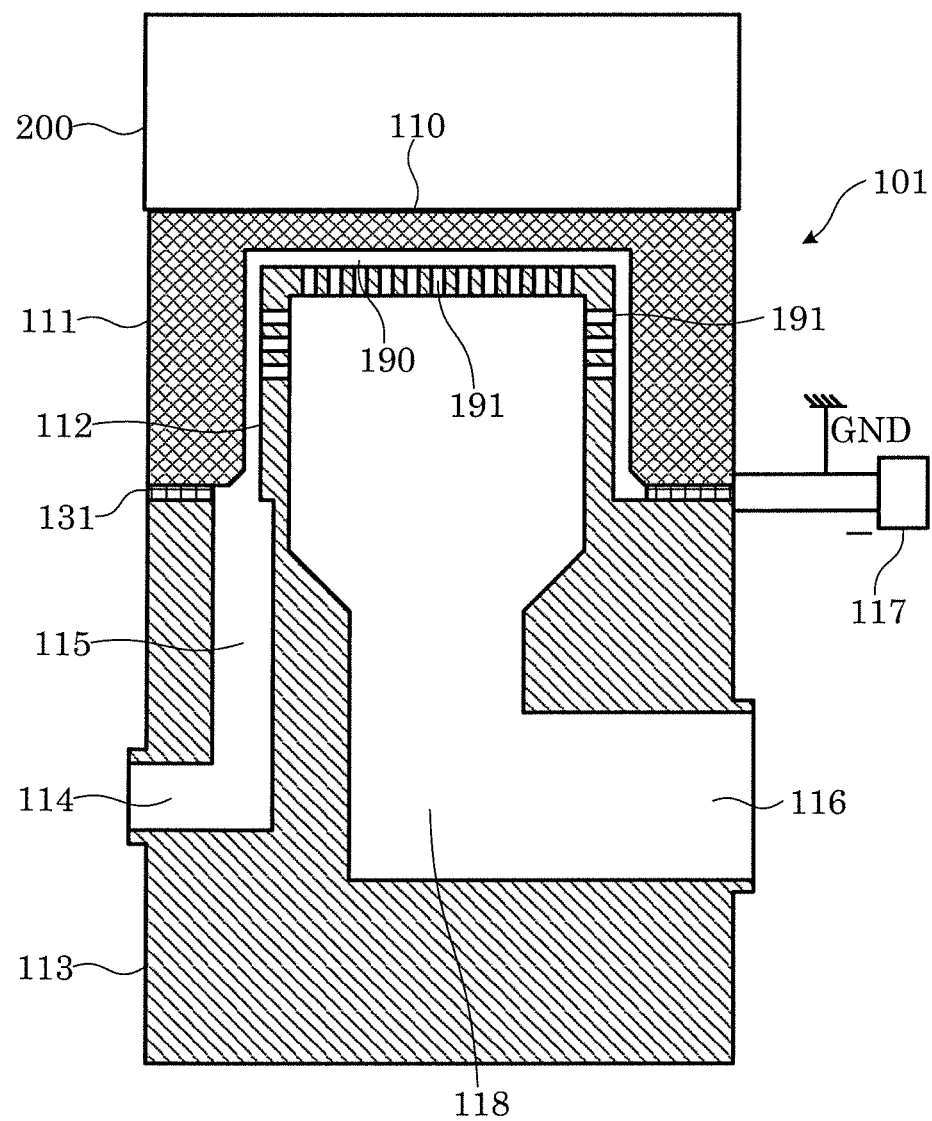
FIG. 6 is a cross-sectional view of the heat-receiving unit according to Embodiment 1 in an upside-down orientation.

FIG. 2 is a perspective view of an exterior of the heat-receiving unit along a negative direction of the Y-axis. FIG. 3 is a perspective view of the exterior of the heat-receiving unit from a side opposite to the side shown in FIG. 2. FIG. 4 is an exploded perspective view of the heat-receiving unit. FIG. 5 is a cross-sectional view of the heat-receiving unit in a first orientation. FIG. 6 is a cross-sectional view of the heat-receiving unit in a second orientation.

As illustrated in these drawings, heat-receiving unit 101 is a device that delivers the heat released from heat-generating body 200 to the working fluid by directly or indirectly contacts heat-generating body 200, and can facilitate the gasification of the working fluid. Heat-receiving unit 101 includes first component 111, second component 112, maintaining component 113, inlet 114, outlet 116, and applier 117.

First component 111 is directly or indirectly connected to heat-generating body 200, delivers the heat from heat-generating body 200 to the internally circulating working fluid, and has conductivity that causes an electric field to occur between first component 111 and second component 112. First component 111 includes a conductive material and functions as an electrode. First component 111 is bottomed cylindrical, but is not limited thereto as long as it has a shape capable of containing the working fluid. In the case of the present embodiment, first component 111 is a cuboid block including a cylindrical space whose outer periphery and inner periphery differ in shape. First component 111 may include a material high in electrical conductivity and thermal conductivity. To be specific, first component 111 can, for example, include a metal such as copper, aluminum, or an alloy thereof. In the case of the present embodiment, copper is used for first component 111.

In the case of the present embodiment, an inner surface of first component 111 including an inner peripheral surface and an inner bottom surface, i.e., the surface of first component 111 facing second component 112, is covered in micro-asperities and is a so-called rough surface. This makes it possible for air bubbles to occur more easily from the working fluid and to facilitate the gasification of the working fluid. A method for roughening the surface of first component 111 is not particularly limited, but can, for example, be a method in which the surface of first component 111 is processed through shot peening and the like, and can also be a method in which the surface is roughened through powder coating (bonding, crimping, sintering, electrodeposition) using a highly thermally conductive diamond and the like.

Outer bottom surface 110 of first component 111 contacts heat-generating body 200. Note that outer bottom surface 110 of first component 111 and heat-generating body 200 are connected via a highly thermally conductive paste or sheet that can flexibly change shape.

Note that the inner surface of first component 111, which contacts the working fluid, may include a conductive layer that contacts the working fluid, and any other portions may include various types of materials that differ from a material of the conductive layer.

Second component 112 is a bottomed tubular component disposed along an interior shape of first component 111 and forms gasification space 190 by being disposed within first component 111 spaced apart from first component 111 by a predetermined gap. The base of second component 112 that faces the bottom surface of first component 111 includes through-holes 191. In the case of the present embodiment, since the inner peripheral surface of first component 111 is cylindrical, the circumferential surface of second component 112 is also cylindrical, and both are disposed along the same center. Gaps between the bases and the peripheries of second component 112 and first component 111 are disposed roughly evenly spaced. The periphery of second component 112, which faces the inner peripheral surface of first component 111, also includes through-holes 191. Through-holes 191 in the periphery of second component 112 are arranged in a circumferential direction and a radial direction. Note that intervals between through-holes 191 along the circumferential direction and the radial direction are not particularly limited. In FIG. 4, illustration of through-holes 191 arranged along the circumferential direction is omitted.

Second component 112 may include a material high in electrical conductivity. To be specific, second component 112 can, for example, include a metal such as copper, aluminum, or an alloy thereof. In the case of the present embodiment, an alloy mainly consisting of aluminum is used for second component 112.

A cross sectional shape of each of through-holes 191 is not particularly limited and can be any shape of choice, e.g. rectangular or circular. Through-holes 191 may be equal in size or have different sizes. The shape and size of each of through-holes 191 may differ per region, may change cyclically, etc. For example, the shape and size of each of through-holes 191 disposed in the base of second component 112 and through-holes 191 disposed in the periphery of second component 112 may coincide and may also differ.

An opening area proximate to first component 111 of each of through-holes 191 may be larger than a medial opening area proximate to second component 112 of each of through-holes 191. In other words, an inner peripheral surface of each of through-holes 191 may be tapered or terraced.

In the case of the present embodiment, the cross sectional shape of each of through-holes 191 is circular and a radius of each of through-holes 191 is smaller than the interval between first component 111 and second component 112. Since the specific interval between first component 111 and second component 112 differs depending on a voltage applied between the electrodes, a flow velocity of the working fluid, and the like, the interval is not particularly limited, but in the case of the present embodiment, the interval is selected from a range of at least 0.5 mm and at most 1.5 mm.

In the case of the present embodiment, through-holes 191 each include a taper (not illustrated) whose diameter gradually enlarges with nearness to first component 111. By applying a voltage between first component 111 and second component 112, portions without through-holes 191 have a large potential difference, the tapers gradually decrease in potential difference, and portions having the through-holes have the lowest potential difference. A pressure difference occurs in the working fluid due to this potential difference. Thus, it is possible to guide the air bubble occurring in the working fluid toward the low-pressure through-holes 191.

A space medial of the cylindrical second component 112 temporarily stores the working fluid having flowed through each of through-holes 191. Note that since the gasified working fluid flows in, a capacity of a medial space is higher than a capacity of gasification space 190.

Maintaining component 113 maintains second component 112 and first component 111 at a predetermined interval, and forms gasification space 190 between second component 112 and first component 111. In the case of the present embodiment, maintaining component 113 is a cubic component integrated to second component 112. Maintaining component 113 maintains an insulated state between first component 111 and maintaining component 113, and is connected to first component 111 due to spacer 131, which seals off a space between first component 111 and maintaining component 113 and prevents the working fluid from leaking, being interposed between first component 111 and maintaining component 113.

In the case of the present embodiment, one lateral surface of maintaining component 113 includes inlet 114 and another lateral surface includes outlet 116. An interior of maintaining component 113 includes inflow passage 115 extending from inlet 114 to gasification space 190, and outflow passage 118 extending from through-holes 191 to outlet 116.

Inlet 114 is an opening that communicates with gasification space 190 via the tubular inflow passage 115, and is a hole for introducing the working fluid into gasification space 190. A position in which inlet 114 and inflow passage 115 are disposed is not particularly limited, but inlet 114 and inflow passage 115 may be disposed in a position at which the working fluid flows in an end of the periphery on another side of the base in the axial direction of the cylindrical gasification space 190. Pipe 104 is attached to inlet 114.

Outlet 116 is an opening that communicates with the space medial of second component 112 via outflow passage 118, and is a hole for allowing the working fluid to flow from the inner space of second component 112. A position in which outlet 116 is disposed is not particularly limited, but in the case of the present embodiment, outlet 116 is disposed in maintaining component 113. Pipe 104 is attached to outlet 116.

Applier 117 is a device for applying a predetermined voltage between first component 111 and second component 112. In the case of the present embodiment, applier 117 is capable of applying a direct current (DC) voltage selected from a range of at least 300 V and at most 10 kV between first component 111 and second component 112 based on a commercial power supply. Note that as long as applier 117 causes a potential difference to occur between first component 111 and second component 112, either a positive voltage or a negative voltage of both electrodes may be connected to a ground (GND) line. Note that in the present embodiment, applier 117 applies a voltage so that the first component has a GND voltage and the second component a negative voltage with respect to the GND.

The working fluid is not particularly limited as long as the working fluid is capable of transporting and releasing the heat received from heat-generating body 200 to radiator 102 via first component 111. For example, a characteristic of the working fluid may be that it boils at a temperature that is less than an upper limit of a permissible temperature of heat-generating body 200. For example, when wanting to maintain heat-generating body 200 at a temperature of 60° C. or lower, the working fluid may have a boiling point below 60° C. Considering safety, the working fluid may be flammable or lowly flammable and low in toxicity.

To be specific, the working fluid can, for example, be a hydrofluorocarbon (HFC) solvent or a hydrofluoroether (HFE) solvent.

An operation of cooling device 100 will be described next.

The working fluid is coercively circulated in cooling device 100 by pump 103, air is circulated in radiator 102 due to fan 121 rotating, and a voltage is applied between first component 111 and second component 112 by applier 117.

In the first orientation of heat-receiving unit 101 shown in FIG. 5, the working fluid that has flowed in from inlet 114 flows into gasification space 190 so that the working fluid drops from an end of the tubular gasification space 190 via inflow passage 115. The heat emitted by heat-generating body 200 is transmitted to the working fluid in gasification space 190 via first component 111, and the working fluid is boiled in gasification space 190. Air bubbles produced by the boiling of the working fluid would be stopped between first component 111 and second component 112 due to surface tension, but an air-liquid interface between the vapor and liquid of the working fluid, i.e., electrostatic pressure directed medial of through-holes 191 occurs on the surface of the air bubbles due to an electric field gradient of a surrounding of through-holes 191 occurring between first component 111 and second component 112. The air bubbles of the working fluid pass though through-holes 191 from gasification space 190 and are carried to the space medial of second component 112 together with the liquid working fluid, due to the pressure from pump 103. With this, the liquid working fluid is constantly supplied on the surface of first component 111 (boiling surface) facing second component 112, making it possible to improve a heat transfer coefficient by facilitating the boiling of the working fluid.

In the second orientation of heat-receiving unit 101 shown in FIG. 6, which is the first orientation of heat-receiving unit 101 turned upside down, the working fluid having flowed in from inlet 114 flows into inflow passage 115 due to the pressure from pump 103, but flows into gasification space 190 due to a capillary action. The inventors have noticed that it is possible to facilitate the capillary action by applying a voltage between first component 111 and second component 112 that form gasification space 190. In other words, the inventors have noticed that it is possible to facilitate the capillary action when a voltage is applied between first component 111 and second component 112 that form gasification space 190, and supply a sufficient amount of the working fluid to the base of gasification space 190 (portion located in upper part in second orientation, but referred to as "base" for convenience sake) proximate to heat-generating body 200, even when the base of the bottomed tubular gasification space 190 is disposed in the vertical upper part, and the opening is disposed in a lower part. An ascending force toward the bottom surface of first component 111 is applied to the air bubbles produced at the base of gasification space 190, but the air bubbles are guided to the space medial of second component 112 by a potential gradient proximate to through-holes 191, and the inventors have further identified that it is possible to produce sufficient cooling. To be specific, when heat-generating body 200 generates heat under the same conditions, a temperature difference between heat-generating body 200 when cooled while contacting heat-receiving unit 101 in the first orientation and heat-generating body 200 when cooled while contacting heat-receiving unit 101 in the second orientation is 2° C. When cooling heat-generating body 200 under the same conditions in a third orientation in which heat-receiving unit 101 is laid sideways, the temperature of heat-generating body 200 showed no significant difference from the first orientation regardless of a position of inlet 114.

Due to the working fluid, which has flowed from outlet 116 via outflow passage 118, arriving in radiator 102 in a mixed gas-liquid state and exchanging heat with the air, the liquid working fluid is cooled, and the gaseous working fluid is condensed and returned to a liquid state. The working fluid, having been liquefied and cooled, is once more returned to gasification space 190 of heat-receiving unit 101.

As described above, cooling device 100 including heat-receiving unit 101 makes it possible to move the working fluid to the base of gasification space 190 with high efficiency due to the electric field applied between first component 111 and second component 112, and to continue coercively emitting the air bubbles of the boiled working fluid to the space medial of second component 112 via through-holes 191, regardless of which orientation heat-receiving unit 101 is in. It is therefore possible to (i) prevent a state in which the working fluid is not sufficiently supplied to the base of the heated up first component 111, (ii) limit so-called dryouts in which the air bubbles adhere to the surface of first component 111 and can no longer move, and (iii) create a state in which the liquid working fluid is widely distributed on the surface of first component 111. It is therefore possible to gasify the working fluid over a large area and effectively cool heat-generating body 200 through the latent heat of the gasification, regardless of which orientation heat-receiving unit 101 is in.

By disposing through-holes 191 also in the periphery of second component 112, it is possible to also guide the air bubbles produced in the periphery of gasification space 190 medial of second component 112. It is therefore possible to effectively manage instantaneous temperature changes even when first component 111 has a high temperature due to heat-generating body 200 instantly having a high temperature since it is possible to effectively emit the air bubbles from heat-receiving unit 101 over a comparatively large area.

Since it is possible to facilitate the capillary action due to the voltage applied between first component 111 and second component 112, and to maintain the flow of the working fluid regardless of which orientation heat-receiving unit 101 is in, it is possible to circulate the working fluid even in pump 103 with low performance. Pump 103 can, therefore, be reduced in size and cooling device 100 can also possibly be reduced in size.

Embodiment 2

An embodiment of a projector included in cooling device 100 will be described next. Note that components (portions) with effects, functionality, shape, configuration, structure, etc., similar to Embodiment 1 have the same reference numeral and description thereof may be omitted. Hereinafter, differences with Embodiment 1 will mainly be described, and overlapping description may be omitted.

Figure 7:
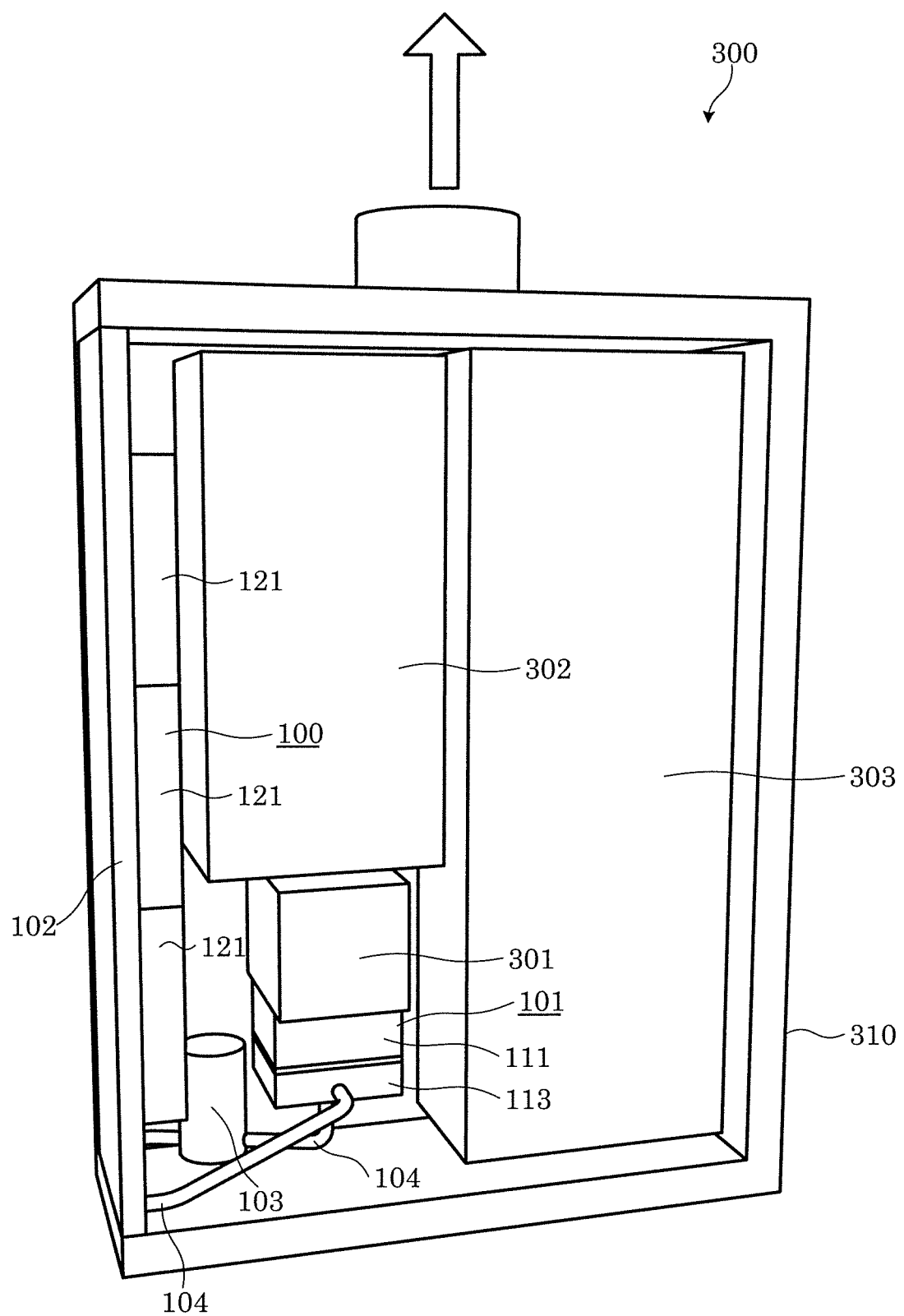
FIG. 7 is a perspective view of an interior of a projector according to Embodiment 2 having a portion cut out.

FIG. 7 is a perspective view of an interior of the projector having a portion cut out. As illustrated in the drawing, projector 300 is a device that projects video on a screen, structure, etc. based on an inputted video signal, and includes last light source 301, light emitter 302, and projection element 303. In the case of the present embodiment, projector 300 is a high-brightness device used in projection mapping, etc., and is disposed in an orientation in which the video is projected upward.

Laser light source 301 is a semiconductor device that emits laser light such as blue light or ultraviolet light to be excited in light emitter 302 for emitting white light. In the case of the present embodiment, it is possible to cause multiple laser beams to oscillate simultaneously in order to emit white light with a high brightness.

Light emitter 302 is a device capable of emitting light with a different wavelength from the laser light based on the laser light from laser light source 301. In the case of the present embodiment, light emitter 302 includes a phosphor is capable of emitting fluorescent light having a longer wavelength than the laser light by exciting the laser light emitted from laser light source 301, and emits quasi-white light by combining multiple types of phosphors.

Projection element 303 is a device that projects an image on a screen, structure, etc. based on the white light from light emitter 302, and includes a processor for visualizing an input video signal, an optical system for projecting the video, etc.

Projector 300 is a system that cools laser light source 301 being heat-generating body 200, and includes cooling device 100 having heat-receiving unit 101, radiator 102, and pump 103. Applier 117 is embedded in a power-supply device (not illustrated in the drawings) of projector 300, and is supplied with a voltage from the power-supply device of projector 300 to be applied between first component 111 and second component 112.

Radiator 102 is disposed roughly on an entire lateral surface of the rectangular casing 310 that functions as the outer shell of projector 300. Multiple fans 121 are attached to an inside of casing 310.

In heat-receiving unit 101, the outer surface of the base of first component 111 is attached in a contacting state to a lateral surface of laser light source 301. In the case of the present embodiment, an insulative and highly thermally conductive thermal conductivity sheet (not illustrated in the drawings) is disposed between heat-receiving unit 101 and laser light source 301.

In the second orientation, first component 111 becomes an upper side and second component 112 becomes a lower side in the vertical direction. The outlet is disposed below a bottom end of maintaining component 113.

As described above, it is possible to effectively cool laser light source 301 due to the projection direction of projector 300 used in the projection mapping while hardly reducing the cooling effect even when heat-receiving unit 101 is in an orientation different from the first orientation, e.g. the second orientation.

Note that the present disclosure is not limited to the above embodiments. For example, other embodiments that can be realized by optionally combining structural elements described in the present specification or by removing certain structural elements may be embodiments of the present disclosure. Variations obtainable through various modifications to the above embodiments that can be conceived by a person of ordinary skill in the art without departing from the essence of the present disclosure, that is, the meaning of the recitations in the claims are included in the present disclosure.

For example, first component 111 and second component 112 are described as being bottomed cylindrical, but the shape of other portions is not particularly limited as long as the inner peripheral surface of first component 111 and the circumferential surface of second component 112 facing the inner peripheral surface of first component 111 are similar in shape or roughly similar in shape. The inner peripheral surface of first component 111 and the circumferential surface of the second component can not only be bottomed cylindrical, but can be any shape of choice, e.g. elliptical, track-shaped, or rectangular with rounded corners.

The circumferential surface of second component 112 may be cut away, either chamfered or rounded, to form the taper of each of through-holes 191.

Embodiment 2 exemplifies projector 300 including cooling device 100, but cooling device 100 is not limited to being used in projector 300, and may also be used in electronic devices expected to be used in multiple orientations, e.g. a mobile computer.

Cooling device 100 may also include multiple heat-receiving units 101. In this case, heat-receiving units 101 may be connected in parallel and may also be connected in series.

A case of radiator 102 exchanging heat with the air (atmosphere) is described, but may also exchange heat with a liquid fluid, e.g. water.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

Since the cooling device in the present disclosure has high cooling efficiency regardless of which orientation the cooling device is operating in, the cooling device is optimal for cooling electronic components with a high calorific value that are expected to be used in various orientations.

What is claimed is:

1. A cooling device, comprising:
   a heat-receiving unit that receives heat from a heat-generating body;
   a working fluid that transports the heat received by the heat-receiving unit;
   a radiator that cools the working fluid from the heat-receiving unit; and
   a pump for moving the working fluid exiting the radiator to the heat-receiving unit, wherein
   the heat-receiving unit includes:
      a first component that is bottomed tubular, receives the heat from the heat-generating body, and gasifies the working fluid;
      a second component that is bottomed tubular, is disposed within the first component spaced apart from the first component by a predetermined gap, and has a base including a plurality of through-holes;
      an inlet for introducing the working fluid to a gasification space between the first component and the second component;
      an outlet for emitting the working fluid that has passed through the plurality of through-holes and has flowed medial of the second component; and
      an applier that applies a voltage to the first component and the second component each including a conductive material.

2. The cooling device according to claim 1, wherein the second component further includes a plurality of through-holes in a periphery facing an inner peripheral surface of the first component.

3. A projector, comprising:
   a laser light source that emits laser light;
   a projection element that projects an image based on the laser light; and
   a cooling device that cools the laser light source, wherein the cooling device includes:
- a heat-receiving unit that receives heat from the laser light source;
- a working fluid that transports the heat received by the heat-receiving unit;
- a radiator that cools the working fluid from the heat-receiving unit; and
- a pump for moving the working fluid exiting the radiator to the heat-receiving unit, and the heat-receiving unit includes:
- a first component that is bottomed tubular, receives the heat from a heat-generating body, and gasifies the working fluid;
- a second component that is bottomed tubular, is disposed within the first component spaced apart from the first component by a predetermined gap, and has a base including a plurality of through-holes;
- an inlet for introducing the working fluid to a gasification space between the first component and the second component;
- an outlet for emitting the working fluid that has passed through the plurality of through-holes and has flowed medial of the second component; and
- an applier that applies a voltage to the first component and the second component each including a conductive material.

* * * * *